(12) United States Patent
Buck et al.

(10) Patent No.: US 7,873,926 B2
(45) Date of Patent: Jan. 18, 2011

(54) METHODS FOR PRACTICAL WORST TEST DEFINITION AND DEBUG DURING BLOCK BASED STATISTICAL STATIC TIMING ANALYSIS

(75) Inventors: Nathan C. Buck, Underhill, VT (US); Eric A. Foreman, Fairfax, VT (US); James C. Gregerson, Hyde Park, NY (US); Jeffrey G. Hemmett, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 12/059,015

(22) Filed: Mar. 31, 2008

(65) Prior Publication Data

US 2009/0249270 A1    Oct. 1, 2009

(51) Int. Cl.
 G06F 17/50    (2006.01)
 G06F 9/45    (2006.01)

(52) U.S. Cl. ................................. 716/6; 5/18
(58) Field of Classification Search ................. 716/5–6, 716/18
 See application file for complete search history.

(56) References Cited

U.S. PATENT DOCUMENTS

| | | | |
|---|---|---|---|
| 5,095,454 A | 3/1992 | Huang | |
| 5,636,372 A | 6/1997 | Hathaway et al. | |
| 6,321,362 B1 | 11/2001 | Conn et al. | |
| 7,086,023 B2 * | 8/2006 | Visweswariah | 716/6 |
| 7,111,260 B2 * | 9/2006 | Visweswariah | 716/6 |
| 7,428,716 B2 * | 9/2008 | Visweswariah | 716/6 |
| 2005/0065765 A1 | 3/2005 | Visweswariah | |
| 2005/0066296 A1 | 3/2005 | Visweswariah | |
| 2005/0066298 A1 | 3/2005 | Visweswariah | |
| 2006/0085775 A1 | 4/2006 | Chang et al. | |
| 2006/0101361 A1 | 5/2006 | Foreman et al. | |
| 2007/0226667 A1 | 9/2007 | Chadwick, Jr. et al. | |
| 2007/0234256 A1 | 10/2007 | Chang et al. | |

OTHER PUBLICATIONS

Chopra, et al., "A New Statistical Max Operation for Propagating Skewness in Statistical Timing Analysis", Proceedings of the 2006 IEEE/ACM International Conference on Computer-Aided Design Table of Contents, San Jose, CA, Session: Statistical Timing Analysis Table of Contents, pp. 237-243.

Jess, et al., "Statistical Timing for Parametric Yield Prediction of Digital Integrated Circuits", Design Automation Conference, Jun. 2003, Anaheim, CA, pp. 932-937.

Visweswariah, et al., "First-Order Incremental Block-Based Statistical Timing Analysis", Proceedings of the 41st Design Automation Conference, Jun. 2004, San Diego, CA, pp. 331-336.

* cited by examiner

*Primary Examiner*—Nghia M Doan
(74) *Attorney, Agent, or Firm*—Wood, Herron & Evans LLP

(57) ABSTRACT

Methods for analyzing timing of an integrated circuit using block-based static statistical timing analysis and for practical worst test definition and debug. The method includes building a timing graph, determining a slack for each of the nodes in the timing graph, and identifying a statistically worst slack for at least one of the nodes. The method further includes replacing this statistically worst slack with a proxy worst slack.

2 Claims, 1 Drawing Sheet

METHODS FOR PRACTICAL WORST TEST DEFINITION AND DEBUG DURING BLOCK BASED STATISTICAL STATIC TIMING ANALYSIS

FIELD OF THE INVENTION

The invention relates generally to integrated circuit design and, in particular, to statistical static timing analysis for analyzing the timing characteristics of an integrated circuit, before physically fabricating the integrated circuit, by propagating arrival and required arrival times of an integrated circuit in a probabilistic or statistical fashion.

BACKGROUND OF THE INVENTION

Static timing analysis (STA) is a common method of computing the expected timing of a digital circuit to identify problem areas of an integrated circuit during the design phase and in advance of actual fabrication. The timing of the integrated circuit is simulated to determine if it meets the timing constraints and, therefore, is likely to operate properly if fabricated in accordance with the tested design.

Deterministic STA (DSTA) propagates timing quantities, such as arrival times, required arrival times, and slews, along with any other timing related quantities (guard times, adjusts, asserts, etc.), as single valued deterministic data. DSTA only covers a single corner of a space of process variations with each individual timing run. A corner is a set of input values for parameters that may include temperature of the circuit, input voltage, and various manufacturing parameters of an integrated circuit. In order to evaluate the impact that a given parameter will have on timing, multiple DSTA timing runs must be executed with parameters that affect timing set at several maximum and minimum corners, such as high and low temperature, high and low voltages, and various processing conditions. For example, DSTA timing runs may compare a corner characterized by a combination of high input voltage, a high operating temperature, and the worst manufacturing parameters with a corner characterized by a combination of a low input voltage, a low operating temperature, and the best manufacturing parameters. As a check of the performance of the integrated circuit design, many or all of the corners may be run and the integrated circuit design adjusted until all of the corners pass the timing tests. These results reflect the extreme performance bounds of the integrated circuit and may require numerous timing runs to fully explore the space of process variations. Even then, the results may be overly pessimistic and misleading for optimization tools.

Statistical static timing analysis (SSTA) propagates timing quantities as statistical distributions instead of as single valued deterministic data. In contrast to the DSTA approach that only predicts a single corner of the space of process variations with each timing run, a single timing run using SSTA predicts the performance of the integrated circuit over the entire space of process variations. Consequently, in order to close timing, a single SSTA timing run may replace multiple DSTA timing runs. For example, assuming N parameters (i.e., sources of variation) and two corners per parameter, then $2^N$ corners would have to be analyzed by individual DSTA timing runs to match the effectiveness of a single SSTA run. Hence, SSTA is far more computationally efficient than DSTA. A test run that passes in a single process corner under a DSTA run may actually fail in one or more other performance-limiting corners in the process space, which SSTA would reveal. SSTA methods can, therefore, reduce the exaggerated pessimism inherent in DSTA.

SSTA operates on a timing graph comprised of nodes, which represent points at which signal transitions can occur, and edges that connect incident nodes. Timing values are computed for the timing graph at each node based upon arrival times (ATs), which define the time (or the time distribution) at which a given signal arrives at a timing point, and required arrival times (RATs), which defines the time (or the time distribution) at which the signal is required to get to the timing point, in order to meet the timing requirements. These ATs and RATs are used to compute timing metrics in the form of slacks at nodes (RAT minus AT for late mode and AT minus RAT for early mode). A negative value for either a late mode slack or an early mode slack indicates a timing constraint violation.

Typically, slack data is only collected for timing qualification at a subset of all of the timing graph nodes, sometimes referred to as test points, or endpoints. These endpoints are frequently defined as those nodes that are either primary outputs of the circuit, or those that control data propagation (e.g. the input to storage elements such as latches). There frequently are multiple slacks incident at these nodes, due to both the backward propagated RAT data from upstream nodes, and also due to any timing tests that may be present on those nodes (e.g. setup or hold tests). These slacks may be called edge slacks, as they arise from the timing and test segments that form the graph edges incident on the node of interest. The final slack value for that node is defined as the minimum of all edge slacks, as this is the limiting slack that can cause timing failure.

In deterministic timing analysis, a 'traditional' deterministic minimum operation is used, where the smallest of all the incident edge slacks is used to define the nodal slack value. For this reason, an individual edge slack can never be worse than the node slack, and the node slacks always capture the worst timing constraint violations.

In block-based SSTA, statistical minimum and maximum operations used to calculate a node slack for the propagated statistical distributions. As the input data to these operations are functions (statistical distributions), the output of a statistical minimum or maximum operation is also a function. These propagated distributions will typically overlap such that each one will produce a minimum (or maximum) some percentage of the time over numerous samples. Therefore the output function is defined as a linear combination of all of the inputs, with each input weighted by the probability that it will produce either the minimum or the maximum result. Therefore, failing results in a timing report cannot be easily correlated with the actual failing test that produced the fail, which increases the difficulty to trace failing tests as required to resolve timing issues.

Moreover, in block-based SSTA reporting of the slack distribution, an edge slack for a propagated distribution can be worse than the slacks of the nodes connected by the edge because of the statistical maximum and minimum operations performed on the propagated distributions. Problems arise because the timing correctness of a circuit design is often determined by ensuring that all edge slacks are non-negative or, more generally, are greater than some user-specified threshold. Because slacks of the nodes connected by an edge may be higher than the slack of the edge, this leads to a situation in which a timing constraint violation is reported on an edge. However, the slacks of the nodes connected by the edge, which the designers and optimization tools generally use, forming the sink slack do not indicate a timing constraint violation. Therefore, designers and optimization tools may be confused or mislead because of the slacks of the edges are not considered.

Accordingly, there is a need for an improved method for practical worst test definition and debug during block-based SSTA that overcomes these and other deficiencies of conventional block-based SSTA.

SUMMARY OF THE INVENTION

In an embodiment of the invention, a method is provided for analyzing timing of an integrated circuit using static statistical timing analysis. The method includes building a timing graph having a plurality of nodes and a plurality of edges connecting the nodes, forward propagating a first set of probabilistic distributions in the timing graph, and statistically calculating an arrival time of the first set of probabilistic distributions at each of the nodes. The method further includes backward propagating a second set of probabilistic distributions in the timing graph and statistically calculating a required arrival time of the second set of probabilistic distributions at each of the nodes. A statistically worst slack is identified for at least one of the nodes from the arrival times and the required arrival times either through a slack calculation based upon the arrival times and the required arrival times or through required arrival time calculations. The method further includes replacing the statistically worst slack for at least one of the edges with a proxy worst slack.

DETAILED DESCRIPTION

Figure 1:
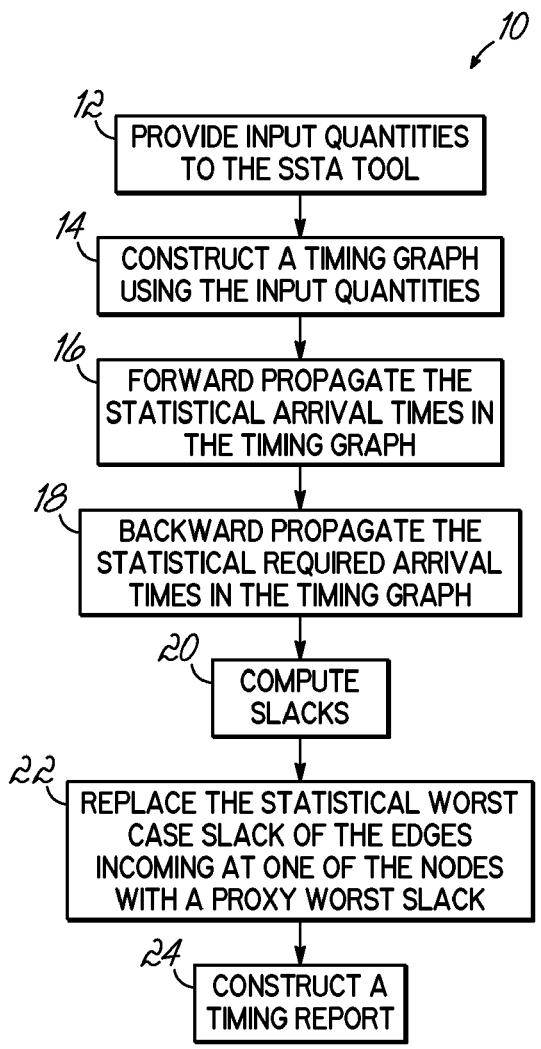
FIG. 1 is a flow chart of a method of conducting statistical static timing analysis of an integrated circuit in accordance with an embodiment of the invention.

With reference to FIG. 1, a process flow 10 for a statistical static timing analysis (SSTA) tool is shown. The SSTA tool utilizes a block-based approach that propagates one probability distribution from each node to the next node and, so on until it reaches a sink node using a statistical maximum operation for early mode arrival times (setup timing constraint) or a statistical minimum operation for late mode arrival times (hold timing constraint).

In block 12, inputs are supplied to the SSTA tool. Specifically, the SSTA tool reads and flattens a netlist representing the structure of the circuit to be analyzed, a set of timing assertions, a set of canonical delay models governing the sources of variation in the space of process variations, sensitivities relating the delay attributable to each individual parameter, and statistical information describing the sources of variation. The timing assertions, each of which can be either deterministic or probabilistic, may include arrival times at the primary inputs, required arrival times at the primary outputs, information about the phases of the clock, and details of external loads that are driven by the primary outputs. The canonical delay model, which may be a parameterized first-order expansion, permits the SSTA tool to determine the delay of a gate or wire as a function not only of traditional delay-model variables (like input slew or rise/fall time, and output load) but also as a function of the sources of variation.

In block 14, the SSTA tool constructs a timing graph from the netlist. The timing graph contains nodes at which signal transitions occur and edges connecting various incident nodes. A typical static timing analysis tool analyzes a synchronous design description for timing violations by breaking down the design into individual timing paths in the timing graph. The timing graph consists of nodes and edges representing delays in the circuit incurred when a logical transition (either from low to high or from high to low) is transmitted through a circuit component, such as a gate or wire. Each path has a source node (i.e., a place in a design description where data is launched by a reference signal edge) and a sink node (i.e., a place in the design description where data is captured by a reference signal edge). The static timing analysis tool calculates a signal propagation delay corresponding to each individual timing path in the timing graph.

Figure 2:
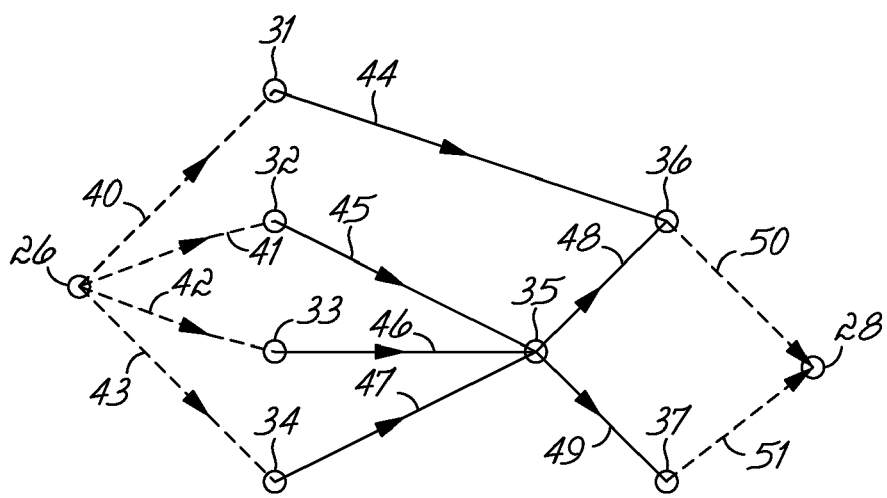
FIG. 2 shows a representative timing graph generated by a timing run in statistical static timing analysis.

With reference to FIG. 2, a representative timing graph is shown that includes a source node 26, a sink node 28, a plurality of nodes 31-37 connected between the source node 26 and sink node 28, and edges 40-51. Nodes 31-34 represent primary inputs of the circuit represented by the timing graph and nodes 36, 37 represent primary outputs.

In block 16, the SSTA tool computes early mode and later mode ATs at each node by forward propagating signals in the form of probabilistic distributions from the source node to the sink node. ATs are typically stored on the nodes of the timing graph and delays of individual gates and wires are typically stored on the edges of the timing graph. Signals are propagated through edges by adding edge delays to signal ATs. When multiple ATs are propagated along different edges to each of the nodes, the AT at the node is computed as the statistical maximum (for late mode ATs) or the statistical minimum (for early mode ATs) of the incoming edge delays. A late mode AT is the earliest time at which the corresponding signal is guaranteed to be stable at its correct logical value after the signal has traversed any of the possible paths of the integrated circuit. An early mode AT is the earliest time at which the corresponding signal can change from its stable logical value during the previous clock cycle. The output of a node cannot change earlier than the early mode AT.

At each node, the mean and variance of the statistical maximum AT is calculated using either analytical formulas or numerical methods, understood by a person having ordinary skill in the art of SSTA. Each output parameter sensitivity is computed by linearly combining all input data (upstream AT+respective edge delays), with each input being weighted by it's respective tightness probability. Generally, a tightness probability is the probability that the random variable is the greatest of a set. Arrival tightness probabilities are determined that reflect the probabilities that the arrival time at each of the nodes may be dominated by one or the other of the incoming edges. The first and second moments of the resulting distribution are matched by selecting an appropriate mean and random sensitivity.

In block 18 and after the conclusion of forward propagation, probabilistic distributions representing RATs are backward propagated by the SSTA tool through the timing graph. When multiple RATs are propagated along different edges to a node, the RAT at the node is computed as the statistical maximum (for early mode RATs) or the statistical minimum (for late mode RATs) of the RATs of the incoming edges. A late mode RAT indicates the latest time within the clock period of a given clock phase that a signal transition may occur at the node without violating a timing constraint. An early mode RAT indicates the earliest time within the clock period of a given clock phase that a signal transition may occur at the node without violating a timing constraint. Delays are subtracted from RATs in backward propagation as timing progresses from the sink node back to the source node. Required arrival tightness probability of an edge is defined as the probability that the RAT at a node is determined by that edge.

In addition to the propagated RATs described above, the RAT calculation also considers any timing constraints that are incident on the current node. These include things such as setup and hold constraints at latch inputs, as well as pulse width tests, loop cut tests, clock gating tests, etc. Setup timing constraints enforce a maximum delay on a timing path relative to the reference signal path. Hold timing constraints enforce a minimum delay on a timing path relative to the reference signal path. Each constraint also contributes a RAT indicating the timing results of that constraint on the current incident node. These constraints may be handled in a manner analogous to propagated RATs, as they can also be represented as additional edges in a timing graph (either in embodiment, or theoretically), although these are virtual edges between whose ends a test result is calculated, rather than a true physical path for timing propagation. So, the data considered when calculating a minimum slack (or max/min RAT) considers all incident constraint data in addition to all incident propagated data.

In block 20, the SSTA tool uses a difference between the ATs and RATs to compute timing metrics in the form of slacks at each of the nodes (RAT minus AT for late mode and AT minus RAT for early mode), which are defined thus so that a negative slack value will always indicate a violation of a setup or hold timing constraint. A positive slack indicates an amount of time by which a violation of a timing constraint is avoided by a path delay.

Conversely, block 20 may be skipped, with no explicit slack calculation being performed during timing propagation. It is understood by a person having ordinary skill in the art that calculation of the worst RAT will always yield the worst slack. That is, in early mode, calculation of the max RAT will always produce the same solution as explicit calculation of the min slack, and in late mode, calculation of the min RAT will also produce the correct min slack solution. Therefore, the slack calculations may be postponed until they are required for reporting or optimization purposes, if this approach is preferred. The RAT and slack are interchangeable, and either may be propagated with equivalent results, so the embodiments of the invention applies equally well to either explicit min slack calculations, or to max/min RAT calculations.

In block 22, a proxy worst slack is substituted for the statistical worst slack of at least one of the nodes in the timing graph, as opposed to using the worst slack derived from the statistical minimum of all slacks of the edges incoming into the node, and the proxy worst slack is reported in the timing report, as described below. The proxy worst slack, which is flexible in definition, permits the designer to chase a specific issue in the integrated circuit is currently limiting design closure in the timing graph.

In one embodiment of the invention, the proxy worst slack for a set of edges incoming into a node, may consist of the slack of the edge exhibiting the largest tightness (i.e., the most probable edge to cause a fail). In another embodiment of the invention, the proxy worst slack for a set of edges incoming into a node may consist of the slack of the specific edge that produces a worst projected slack. This proxy worst slack may differ, often significantly, from the most probable edge to cause a fail. In yet another embodiment of the invention, the proxy worst slack for a set of edges incoming into a node may consist of one or more slacks of one or more edges with unusually large parameter sensitivities. The parameter sensitivity must exceed a user-defined limit, which is defined by the user on a per-parameter basis, to be considered unusually large. In other embodiments of the invention, the proxy worst slack for a set of edges incoming into a node may consist of specific test types including, but not limited to, setup or hold timing constraints. The proxy worst slack may also be defined as some linear combination of the inputs, using some weighting factors other than the tightness probabilities typically used (e.g., user defined, or based on criticality of the incident paths).

The proxy worst slack may be defined during reporting, fixup, or optimization, using various combinations of the different embodiments, as required to focus on the problem at hand rather than potentially dismiss the node as acceptable (i.e., the case when the statistical minimum slack at the node is passing in the timing graph). That is, the proxy worst slack can be any of the individual criteria in the different alternative embodiments, or may comprise some scaled combination of the individual criteria.

The proxy worst slack may be cached during backward propagation in the initial timing run, which may improve computational efficiency. When the statistical minimum of all slacks for the edges is performed (or max/min for early/late mode RATs is performed), one or more individual slacks of the edges are identified as the statistically worst slack for the corresponding node based upon the user selected criteria for the proxy worst slack and some minimal information identifying these statistically worst slacks for the edges is stored into a side data structure. The data is updated with any incremental change in the RAT at each node. The data may then be used in a flexible manner during reporting, optimization, and fixup, optionally replacing the true edge slack in a user defined manner. Alternatively, the proxy worst slacks may be determined on the fly in real time during reporting, optimization, and fixup, via dynamic re-analysis of all incident slacks on the edges. When the proxy worst slack is desired on edges, timing runs on all edges incident on a node are looped over and those with the desired traits are flagged for use as the proxy worst slack for the edges.

In an alternative embodiment and in addition to being reported in the timing report, the proxy worst slack associated with a node may be used during backward propagation as a substitute for the actual slack at a node. The backward propagation of the proxy worst slack may aid in tracing specific timing problems to their sources along a path. The backward propagation of the proxy worst slack may also provide automated optimization and fixup tools with the appropriate data required to help close timing (in a manner totally contained inside the SSTA tool, with no changes required in the other tools consuming this data). This is embodied by replacing the actual RAT data with RAT data corresponding to the proxy worst slack, and then invalidating the RAT to trigger a backward propagation. In an incremental SSTA tool, the re-propagation is performed with a minimum overhead, as the re-calculation only affects those cones of logic affected by the RAT change, and only occurs when a timing data query is made within those cones. Similarly, if slack data itself is propagated, the proxy worst slack itself may be propagated.

In block 24, a timing report is produced by the SSTA tool. Information generated in the timing report may be used to constrain timing paths during circuit synthesis to reduce timing constraint violations. The timing report typically includes arrival times, required arrival times, slacks, and slews at each node of the integrated circuit expressed as probability distributions. Specifically, the information in the timing report may include, but is not limited to, mean value and variance for each timing quantity, a parameterized representation of the distribution of each timing quantity, a graphical representation of the distribution of each timing quantity, and a correlation report between these various timing quantities. Various automatic audits, such as checking for excessive parameter sensitivities, may be built into the timing report. Excessive parameter sensitivities typically must be reduced in order to improve the robustness of the circuit. The timing report also includes the proxy worst slacks for the nodes that include incoming edges, which are determined as outlined hereinabove.

Applicants hereby incorporate by reference herein the entire disclosure of U.S. Publication No. 2005/0065765, published Mar. 24, 2005 from Ser. No. 10/666,353 filed Sep. 19, 2003 and entitled "System and Method for Statistical Timing Analysis of Digital Circuits", for additional description of the SSTA process.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for analyzing timing of an integrated circuit using a static statistical timing analysis (SSTA) tool, the method comprising:

computing a timing graph from a netlist using the SSTA tool, the timing graph having a plurality of nodes and a plurality of edges connecting the nodes;

in response to forward propagating a first set of probabilistic distributions in the timing graph, statistically calculating with the SSTA tool an arrival time of the first set of probabilistic distributions at each of the nodes;

in response to backward propagating a second set of probabilistic distributions in the timing graph, statistically calculating with the SSTA tool a required arrival time of the second set of probabilistic distributions at each of the nodes;

identifying with the SSTA tool a statistically worst slack for a node in the timing graph from the arrival times and the required arrival times either through a slack calculation based upon the arrival times and the required arrival times or through required arrival time calculations;

determining one or more of the slacks of the edges arriving at the node in the timing graph with a parameter sensitivity that exceeds a user-defined limit;

equating a proxy worst slack to the slack of the edge that produces a worst projected slack: and generating a timing report with the SSTA tool that replaces the statistically worst slack with the proxy worst slack for at least one of the edges arriving at the node in the timing graph at which the statistically worst slack is identified during backward propagation.

2. A method for analyzing timing of an integrated circuit using a static statistical timing analysis (SSTA) tool, the method comprising:

computing a timing graph from a netlist using the SSTA tool, the timing graph having a plurality of nodes and a plurality of edges connecting the nodes;

in response to forward propagating a first set of probabilistic distributions in the timing graph, statistically calculating with the SSTA tool an arrival time of the first set of probabilistic distributions at each of the nodes;

in response to backward propagating a second set of probabilistic distributions in the timing graph, statistically calculating with the SSTA tool a required arrival time of the second set of probabilistic distributions at each of the nodes;

identifying with the SSTA tool a statistically worst slack for a node in the timing graph from the arrival times and the required arrival times either through a slack calculation based upon the arrival times and the required arrival times or through required arrival time calculations;

calculating a tightness probability for each of the edges;

comparing the tightness probabilities to identify a largest tightness probability;

equating a proxy worst slack to the slack for the edge exhibiting the largest tightness probability; and generating a timing report with the SSTA tool that replaces the statistically worst slack with the proxy worst slack for at least one of the edges arriving at the node in the timing graph at which the statistically worst slack is identified during backward propagation.

* * * * *